United States Patent [19]

Steinhagen et al.

[11] Patent Number: 5,126,745
[45] Date of Patent: Jun. 30, 1992

[54] CIRCUIT ARRANGEMENT FOR GENERATING A CONTROL SIGNAL IN DEPENDENCE UPON THE OCCURRENCE OF AN EXTREME VALUE OF A SINUSOIDAL OSCILLATION AND USE OF SUCH A CIRCUIT ARRANGEMENT

[75] Inventors: Wolfgang Steinhagen, Mauern; Ulrich Kaiser, Warstein, both of Fed. Rep. of Germany

[73] Assignee: Texas Instruments Deutschland GmbH, Freising, Fed. Rep. of Germany

[21] Appl. No.: 515,374

[22] Filed: Apr. 27, 1990

[51] Int. Cl.$^5$ .............................. G01S 13/80
[52] U.S. Cl. ...................................... 342/51
[58] Field of Search ................ 342/51; 340/825.54, 340/572; 331/172

[56] References Cited

U.S. PATENT DOCUMENTS

| 4,314,373 | 2/1982 | Sellers | 342/51 |
| 5,073,781 | 12/1991 | Stickelbrocks | 342/51 |

FOREIGN PATENT DOCUMENTS

86746/75 11/1975 Australia .
41011/78 5/1980 Australia .
68340/81 3/1981 Australia .

*Primary Examiner*—Mark Hellner
*Attorney, Agent, or Firm*—James C. Kesterson; Richard L. Donaldson

[57] ABSTRACT

A circuit arrangement is described with the aid of which a control signal can be generated in dependence upon the occurrence of an extreme value of a sinusoidal oscillation. The circuit arrangement (10) includes a storage member (22) which is adapted to be charged via a diode (20) to one of the extreme values of the sinusoidal oscillation. A discharge path (26) for the storage member (22) is present, the time constant of which is so dimensioned that within the period duration of the sinusoidal oscillation an appreciable discharge of the storage member (22) takes place. A switch element (24) controllable by the charge voltage of the storage member (22) furnishes the control signal at its output (14) for the period of time during which the charge voltage at the storage member (22) is smaller than the extreme value of the sinusoidal oscillation. The circuit arrangement can be used in maintaining the oscillations of a resonance circuit stimulated to oscillate by means of a momentary HF carrier wave pulse.

4 Claims, 1 Drawing Sheet

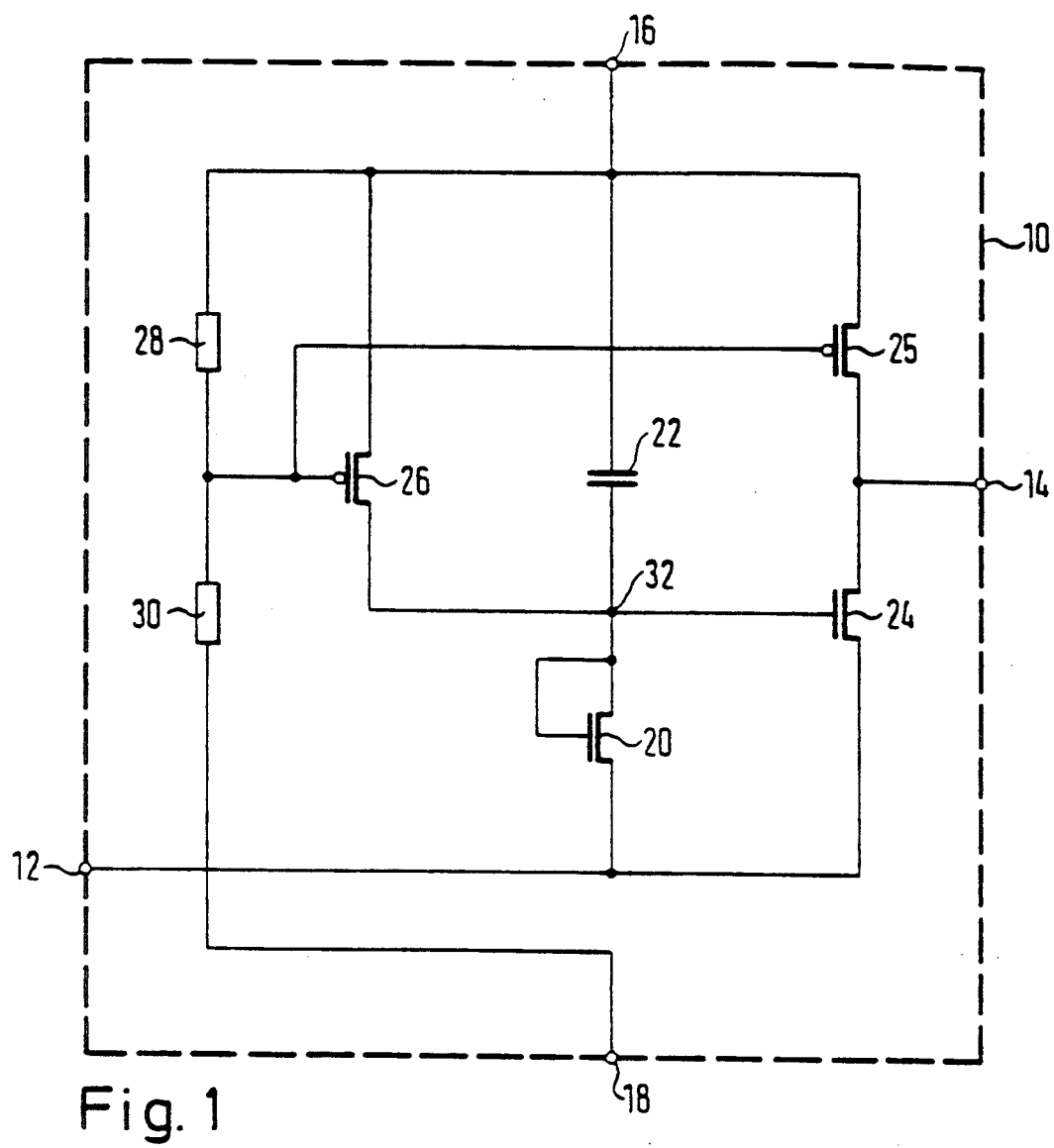
Fig. 1
Fig. 2
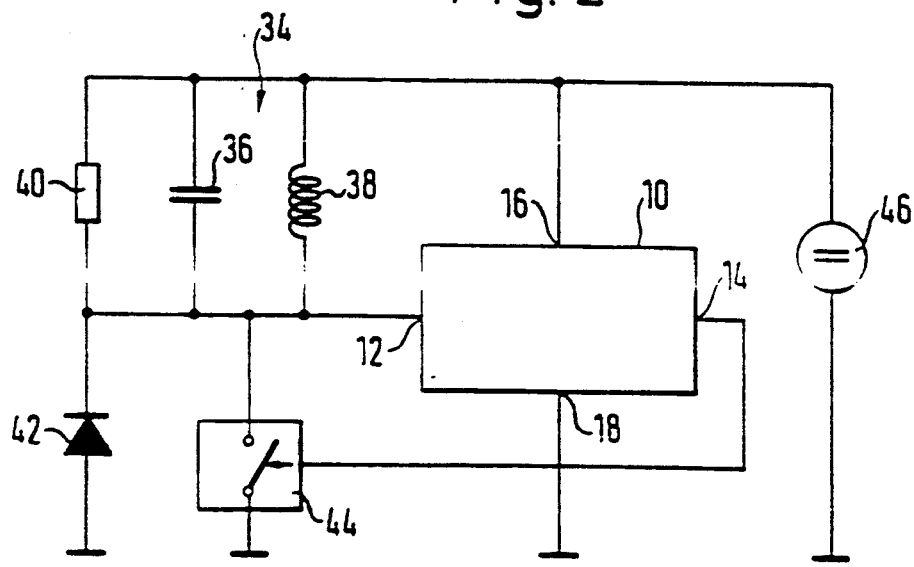

CIRCUIT ARRANGEMENT FOR GENERATING A CONTROL SIGNAL IN DEPENDENCE UPON THE OCCURRENCE OF AN EXTREME VALUE OF A SINUSOIDAL OSCILLATION AND USE OF SUCH A CIRCUIT ARRANGEMENT

The invention relates to a circuit arrangement for generating a control pulse in dependence upon the occurrence of an extreme value of a sinusoidal oscillation and to a use of such a circuit arrangement for maintaining the oscillations of a resonant circuit comprising a coil and capacitor set in oscillation by means of a momentary HF carrier wave pulse.

A resonance circuit has the property that after stimulation with its resonant frequency it continues to oscillate even when the excitation energy is no longer supplied. Since the components of the resonance circuit have however losses and the further components connected thereto can also effect a damping, as a rule the oscillation decays aperiodically very rapidly unless energy is again supplied to the resonance circuit which is at least high enough to compensate the attenuation losses. The energy supply must take place at the correct instant in order to act in the sense of a self-excitation and maintain the oscillation. Consequently, there is a need for a circuit arrangement which can generate a control signal with the aid of which the energy supply to a resonance circuit can be effected with the objective of maintaining the oscillations thereof.

The invention is therefore based on the problem of providing a circuit arrangement of the type mentioned at the beginning with the aid of which without high circuit expenditure such a control signal can be generated and used in a relatively large frequency range of the sinusoidal oscillation.

This problem is solved according to the invention by a storage member which is adapted to be charged via a diode to one of the extreme values of the sinusoidal oscillation, a discharge path for the storage member, the time constant of which is so dimensioned that within the period duration of the sinusoidal oscillation an appreciable discharge of the storage member takes place, and a switch element which is controllable by the charge voltage at the storage member and which for the time duration during which the charge voltage is charging towards and then reaches the extreme value of the sinusoidal voltage furnishes the control signal at its output.

With the circuit arrangement according to the invention at one of the extreme regions of a sinusoidal oscillation a respective pulse can be generated and this relationship is maintained over a relatively large range of the sinusoidal oscillations.

A preferred use of the circuit arrangement according to the invention is shown in FIG. 2. In this use a resonance circuit stimulated to oscillate with the aid of a momentary HF carrier wave pulse is always supplied with the energy it requires for further oscillation in that the control signal generated closes a switch via which the energy supply to the resonance circuit can take place in-phase in each case. Since the control signal is generated at an extreme region of the sinusoidal oscillation the energy supply is necessarily in-phase so that actually an energy supply to the resonance circuit results in the sense of a self-excitation.

In a more specific application the resonance circuit is part of a transponder in which the oscillations of the resonance circuit are used to generate clock signals controlling the function sequence in the transponder. The special feature here is that the transponder does not have its own supply voltage source but is provided merely with a storage capacitor which is charged by rectification of the HF carrier frequency pulse which also stimulates the resonance circuit to oscillate. Immediately after termination of the HF carrier wave pulse the circuit arrangement according to the invention starts the generation of the control signals in dependence on one of the extreme values of the sinusoidal oscillation in the resonance circuit and with the aid of the control signals generated energy is then supplied to the resonance circuit from the storage capacitor and this is continued until the energy in the storage capacitor is used up. This period is utilized for transmitting a message stored in the transponder to a receiving apparatus under the control of the clock signals derived from the sinusoidal oscillation of the resonance circuit.

The invention will now be explained by way of example with the aid of the drawings, wherein:

FIG. 1 is a circuit diagram of the circuit arrangement according to the invention and FIG. 2 is a basic circuit diagram to explain an example of use of the circuit arrangement according to the invention.

The circuit arrangement 10 illustrated in FIG. 1 comprises an HF input 12 to which in operation a sinusoidal oscillation is applied. It also comprises an output 14 at which it can furnish a control signal. A terminal 16 serves as supply voltage terminal and an input 18 serves as ground terminal.

The HF input 12 is connected via a field-effect transistor 20 connected as diode to one plate of a capacitor 22 which acts as storage member as will be explained hereinafter. The other plate of said capacitor 22 is connected to the supply voltage terminal 16. In addition, the HF input 12 is in connection with two series-connected source-drain paths of two further field-effect transistors 24, 25 leading to the supply voltage terminal 16. The connection between the two source-drain paths of the field-effect transistors 24, 25 forms the output 14. The field-effect transistor 20 connected as diode is connected to the gate electrode of the field-effect transistor 24 and to the drain electrode of a further field-effect transistor 26, the source electrode of which is connected to the supply voltage terminal 16 whilst the gate electrode thereof is connected to the gate electrode of the field-effect transistor 25. Also connected to the gate electrode of the field-effect transistor 26 is the connection point of two resistors 28, 30 which are connected in series between the supply voltage terminal 16 and the ground terminal 18.

The field-effect transistors 20 and 24 contained in the circuit arrangement of FIG. 1 are N-channel MOS field-effect transistors and the field-effect transistors 25, 26 are P-channel MOS field-effect transistors.

Due to their connection to the voltage divider comprising the resistors 28 and 30 the field-effect transistors 25 and 26 are applied to a fixed bias voltage and act as constant current sources; the field-effect transistor 25 acts as load resistance for the field-effect transistor 24.

The circuit arrangement of FIG. 1 operates as follows: When a sinusoidal oscillation or sine wave is applied to the HF input 12 the circuit point 32 follows the sinusoidal oscillation until its minimum is reached. As soon as the sinusoidal oscillation starts to rise again the blocking action of the field-effect transistor 20 comes into play so that the circuit point 32 is held at the potential of the minimum of the sinusoidal oscillation. The capacitor 22 acts as storage member for said potential of the minimum of the sinusoidal oscillation. Via the field-effect transistor 26, which is connected in parallel with the capacitor 22 and as already mentioned acts as current source, a discharge of the capacitor 22 takes place, the discharge time constant being set by means of the voltage divider comprising the resistors 28 and 30 in such a manner that within the period duration of the sinusoidal oscillation an appreciable discharge of the storage member takes place, i.e. the potential at the circuit point 32 is changed in positive direction.

As soon as the sinusoidal oscillation at the HF input 12 again approaches its minimum and in particular again reaches a voltage value which is lower than the potential at the circuit point 32 (apart from the threshold voltage at the field-effect transistor 20 connected as diode) the field-effect transistor 20 again becomes conductive so that a charging current flows to the capacitor 22 and as a result the potential at the circuit point 32 is again drawn to the minimum of the sinusoidal oscillation. The short current pulse which flows for recharging of the capacitor 22 results in the field-effect transistor 24 changing to the conductive state for the duration of said current pulse and consequently at the output 14 a negative pulse, the control signal, appears which is clearly related to the minimum of the sinusoidal oscillation at the HF input 12.

A preferred use of the circuit arrangement of FIG. 1 is indicated in FIG. 2 by a schematic circuit diagram.

The circuit illustrated in FIG. 2 is part of a transponder of which however only the components necessary for the explanation of the use of the circuit arrangement of FIG. 1 are shown. The resonance circuit 34 contained in the circuit of FIG. 2 and comprising the capacitor 36 and coil 38 can be stimulated to oscillate by means of an HF carrier wave pulse emitted by a transmitting device. Said pulse may be received by an antenna, not shown in FIG. 2, and supplied to the resonance circuit; however, only the coil 38 can be part of the antenna. The resistor 40 lying parallel to the resonance circuit 34 is shown as representative of all elements damping the resonance circuit 32.

A diode 42 leads from the parallel circuit of the resistor 40, the capacitor 36 and the coil 38 to ground. Parallel to the diode there is a switch 44 which can be closed by the control signal from the circuit arrangement 10. In practice the switch 44 is an electronic switch which on receiving the control signal from the output 14 moves from the nonconductive state to the conductive state.

In FIG. 2 a supply voltage source 46 is illustrated which in the use outlined in a transponder may consist of a capacitor which is charged by rectification of the HF carrier wave pulse by means of the diode 42. The voltage at the capacitor 46 serves as supply voltage for the circuit arrangement 10 and serves simultaneously as energy source from which the resonance circuit 34 under the control of the control signal from the circuit arrangement 10 on each closure of the switch 44 receives an energy pulse which maintains the sinusoidal oscillation in the resonance circuit 34. Of course, it is only possible to maintain the sinusoidal oscillations for a limited period of time which depends on the size of the capacitor 36 and the energy stored therein.

The circuit arrangement 10 generates the control signal at the output 14 always in the region of the minimum of the sinusoidal oscillations in the resonance circuit 34 and consequently the closing of the switch also takes place in this region. This leads to in-phase energy supply to the resonance circuit which is a prerequisite for maintenance of the sinusoidal oscillations.

It is pointed out that the circuit arrangement illustrated in FIG. 1 can readily be modified so that it generates control signals in the region of the maximum of the sinusoidal oscillations. To do this, it would merely be necessary to use P-channel MOS transistors instead of the respective N-channel MOS field-effect transistors used and vice-versa. The use circuit of FIG. 2 could also readily be adapted to another polarity of the control signal from the circuit arrangement 10.

We claim:

1. A system for maintaining the sinusoidal oscillations of a resonance circuit comprising:
   a diode for rectifying a sinusoidal oscillation;
   a storage element suitable for charging to an extreme voltage value of a sinusoidal oscillation through said rectifying diode;
   a discharge path for substantially discharging said storage element during the period of the sinusoidal oscillation;
   a switch element for furnishing a control signal as said storage element is being charged to said extreme voltage of the sinusoidal oscillation, and;
   a series circuit, comprising a resonant circuit and a controllable switch, said series circuit connected in parallel to said storage element, said control signal switching said controllable switch to a conductive position thereby supplying said resonant circuit with supply voltage.

2. The system according to claim 1, wherein said resonant circuit comprises a parallel combination of a coil and a capacitor.

3. System according to claim 2, wherein said coil is a receiving coil in the receiving section of a transponder, and said receiving coil receives a carrier wave pulse.

4. A system according to claim 3, wherein at the termination of said carrier wave pulse, oscillations in the resonance circuit are maintained by said control signal and said oscillations generate clock pulses in the transponder.

* * * * *